(12) United States Patent
Chuang et al.

(10) Patent No.: US 11,854,847 B2
(45) Date of Patent: Dec. 26, 2023

(54) RETICLE POD WITH SPOILER STRUCTURE

(71) Applicant: GUDENG PRECISION INDUSTRIAL CO., LTD., New Taipei (TW)

(72) Inventors: Chia-Ho Chuang, New Taipei (TW); Hsin-Min Hsueh, New Taipei (TW); Shu-Hung Lin, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 16/562,513

(22) Filed: Sep. 6, 2019

(65) Prior Publication Data
US 2020/0335371 A1 Oct. 22, 2020

(30) Foreign Application Priority Data
Apr. 16, 2019 (TW) ................. 108113242

(51) Int. Cl.
*H01L 21/673* (2006.01)

(52) U.S. Cl.
CPC .. *H01L 21/67359* (2013.01); *H01L 21/67386* (2013.01)

(58) Field of Classification Search
CPC ......... H01L 21/67359; H01L 21/67386; H01L 21/67353; H01L 21/67376; G03F 1/66; G03F 7/70741; G03F 7/70983

USPC .......................................... 206/710
See application file for complete search history.

(56) References Cited

U.S. PATENT DOCUMENTS

| | | | | |
|---|---|---|---|---|
| 4,830,182 A | * | 5/1989 | Nakazato | B65D 53/02 206/454 |
| 5,296,893 A | * | 3/1994 | Shaw | G03F 7/70741 355/125 |
| 5,310,075 A | * | 5/1994 | Wyler | F21V 31/00 174/50 |
| 6,273,426 B1 | * | 8/2001 | Daoud | F16J 15/447 174/17 CT |
| 6,568,551 B2 | * | 5/2003 | Grossenbacher | H05K 5/063 220/4.02 |
| 6,719,166 B2 | * | 4/2004 | Ceolin | B65D 43/0206 220/780 |
| 8,623,145 B2 | * | 1/2014 | Bowman | F16J 15/104 118/733 |

(Continued)

*Primary Examiner* — J. Gregory Pickett
*Assistant Examiner* — Jenine Pagan

(57) ABSTRACT

A reticle pod with a spoiler structure includes a body and a cover. A reticle allocation area is centrally disposed at the body. The cover covers the body. A peripheral area of the cover and a peripheral area of the body are fitted together by a protruding portion and a dented portion. The dented portion and the protruding portion jointly form a spoiler structure surrounding the reticle allocation area. The spoiler structure includes a spoiler passage between the dented portion and the protruding portion. The body has at least one sidewall corresponding in position to the spoiler passage to form a particle-collecting space. Particles carried by external air current which enters the spoiler passage end up in the particle-collecting space and thus are denied entry into the reticle allocation area.

8 Claims, 4 Drawing Sheets

(56) References Cited

U.S. PATENT DOCUMENTS

| | | | | |
|---|---|---|---|---|
| 8,807,342 B2* | 8/2014 | Chien | ................. | B65D 81/133 |
| | | | | 206/523 |
| 10,427,841 B2* | 10/2019 | Weisshaupt | ............... | A61L 2/26 |
| 2007/0002516 A1* | 1/2007 | Matsumoto | ....... | H01L 21/67353 |
| | | | | 361/234 |
| 2008/0173560 A1* | 7/2008 | Umeda | ............... | G03F 7/70741 |
| | | | | 206/316.1 |
| 2009/0206558 A1* | 8/2009 | Nameki | ................ | F16J 15/062 |
| | | | | 277/644 |
| 2010/0140126 A1* | 6/2010 | Lu | ........................ | B65D 43/165 |
| | | | | 206/455 |
| 2015/0176897 A1* | 6/2015 | Jun | ........................ | F26B 25/14 |
| | | | | 34/218 |
| 2018/0130687 A1* | 5/2018 | Bonecutter | ....... | H01L 21/67772 |
| 2018/0210349 A1* | 7/2018 | Hsueh | ................ | G03F 7/70741 |

\* cited by examiner

RETICLE POD WITH SPOILER STRUCTURE

CROSS-REFERENCE TO RELATED APPLICATION

This non-provisional application claims priority under 35 U.S.C. § 119(a) on Patent Application No(s). 108113242 filed in Taiwan, R.O.C. on Apr. 16, 2019, the entire contents of which are hereby incorporated by reference.

BACKGROUND OF THE INVENTION

1. Field of the Invention

The present disclosure relates to reticle pods, and in particular to a reticle pod with a spoiler structure.

2. Description of the Related Art

Advanced lithography, especially EUV (Extreme Ultra-violet) lithography, has strict requirement for cleanliness. Lithography defects result from contamination of a reticle by particles. To attain cleanliness and reticle protection, prior art entails using a reticle pod to shut out external particles. The key to micro-contamination control lies in airtightness between the upper and lower covers of a conventional reticle pod. In case of poor airtightness, particles can readily enter the reticle pod to contaminate the reticle therein.

BRIEF SUMMARY OF THE INVENTION

Considering the aforesaid drawbacks of conventional reticle pod, an objective of the present disclosure is to provide a reticle pod with a spoiler structure.

To achieve at least the above objective, the present disclosure provides a reticle pod with a spoiler structure, comprising: a body which a reticle allocation area is centrally disposed at; and a cover for covering the body, wherein a peripheral area of the cover and a peripheral area of the body are fitted together by a protruding portion and a dented portion, and a spoiler structure surrounding the reticle allocation area is jointly formed by the dented portion and the protruding portion, wherein the spoiler structure comprises a spoiler passage disposed between the dented portion and the protruding portion, and the body has at least one sidewall corresponding in position to the spoiler passage to form a particle-collecting space.

In an embodiment of the present disclosure, the dented portion is disposed at the body, the protruding portion is disposed at the cover, and the dented portion is flanked by a sidewall from one side.

In an embodiment of the present disclosure, the dented portion is flanked by the sidewall from two sides.

In an embodiment of the present disclosure, the dented portion is disposed at the cover, the protruding portion is disposed at the body, and the protruding portion is flanked by a sidewall from one side.

In an embodiment of the present disclosure, the protruding portion is flanked by the sidewall from two sides.

In an embodiment of the present disclosure, the protruding portion has a rectangular cross section.

In an embodiment of the present disclosure, the protruding portion has an arcuate cross section.

In an embodiment of the present disclosure, the sidewall has an acute angle.

In an embodiment of the present disclosure, the sidewall has a fillet.

Therefore, according to the present disclosure, the reticle pod with a spoiler structure has a spoiler passage and thus is effective in lengthening a gas flow path to thereby reduce the likelihood that particles carried by a gas will reach a reticle allocation area. Furthermore, the body has at least one sidewall corresponding in position to the spoiler passage, and thus particles carried by an air current which enters the sidewall is unlikely to climb across the sidewall, thereby confining the particles to the spoiler passage; hence, the particles cannot enter the reticle allocation area.

DETAILED DESCRIPTION OF THE INVENTION

To facilitate understanding of the object, characteristics and effects of this present disclosure, embodiments together with the attached drawings for the detailed description of the present disclosure are provided. Various modifications and changes can be made in accordance with different viewpoints and applications to details disclosed herein without departing from the spirit of the present disclosure. Furthermore, the accompanying drawings of the present disclosure are illustrative but are not drawn to scale. Technical features of the present disclosure are illustrated by embodiments and described below, but the embodiments are not restrictive of the claims of the present disclosure.

Figure 1:
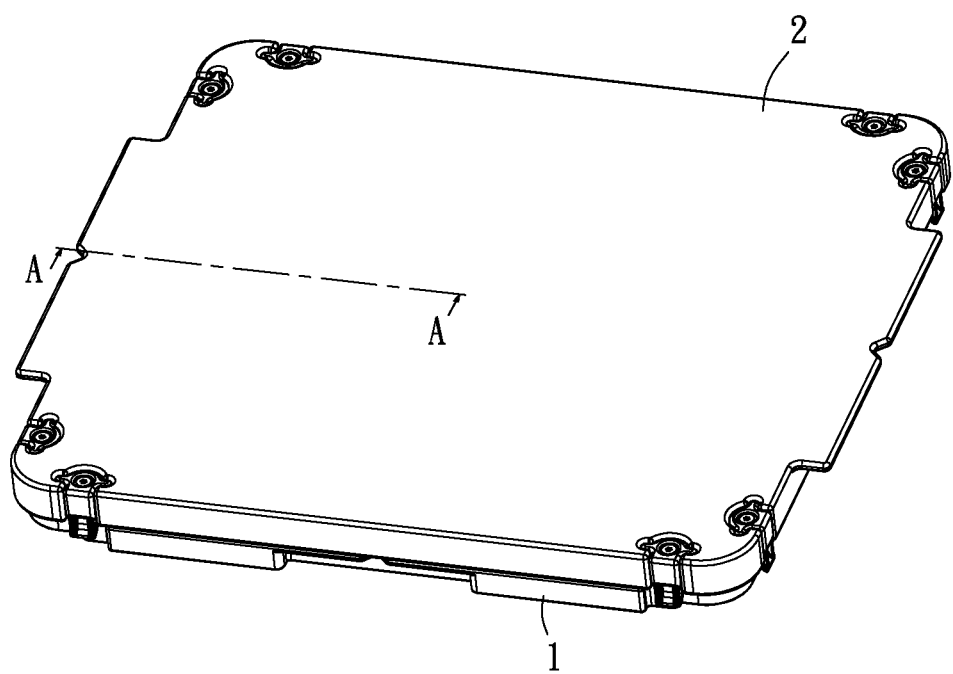
FIG. 1 is a perspective view of a reticle pod with a spoiler structure according to the first embodiment of the present disclosure.
Figure 2:
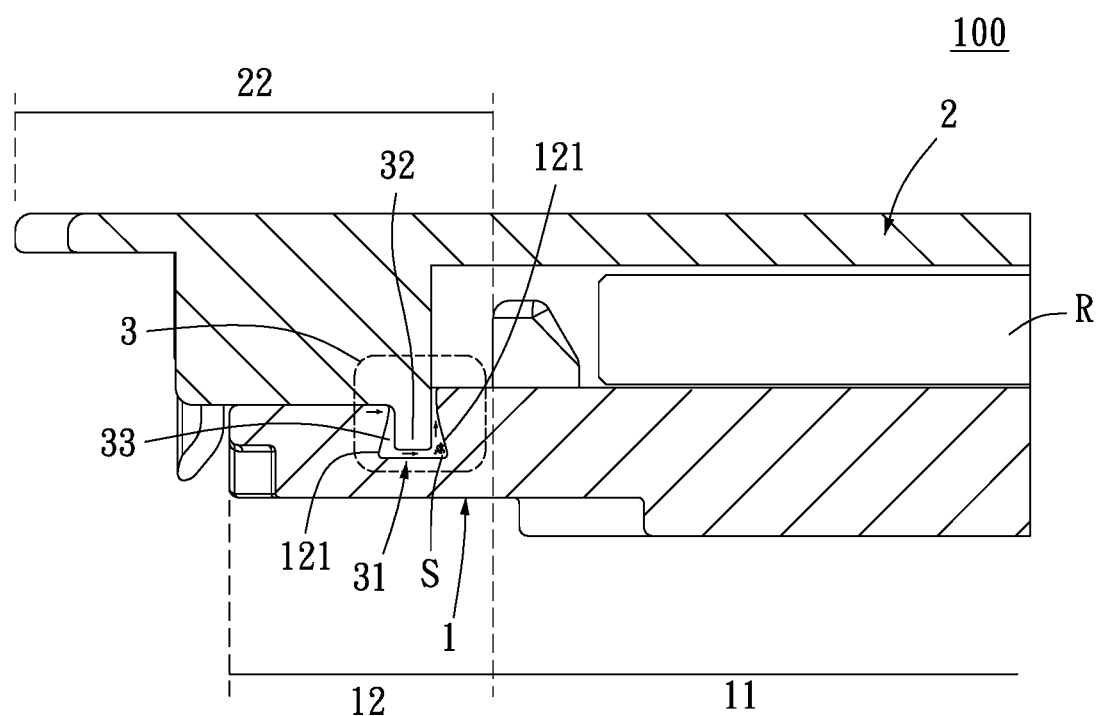
FIG. 2 is a cross-sectional view taken of FIG. 1 along line A-A therein.

Referring to FIG. 1 and FIG. 2, a reticle pod 100 with a spoiler structure according to the first embodiment of the present disclosure comprises a body 1 and a cover 2.

A reticle allocation area 11 is centrally disposed at the body 1 and adapted to accommodate a reticle R. The reticle allocation area 11 is surrounded by a peripheral area 12.

Figure 4:
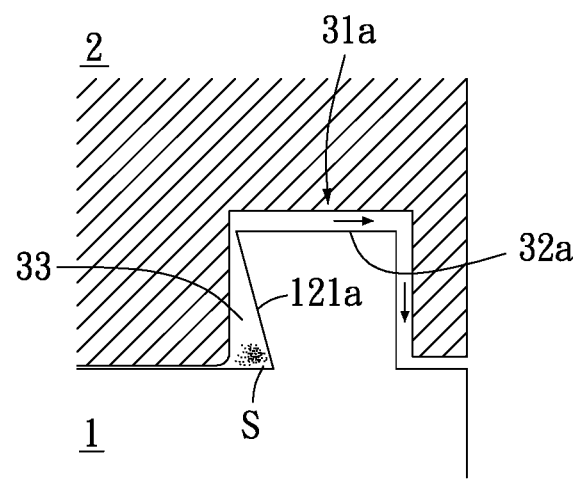
FIG. 4 is a cross-sectional view of the spoiler structure according to the third embodiment of the present disclosure.
Figure 5:
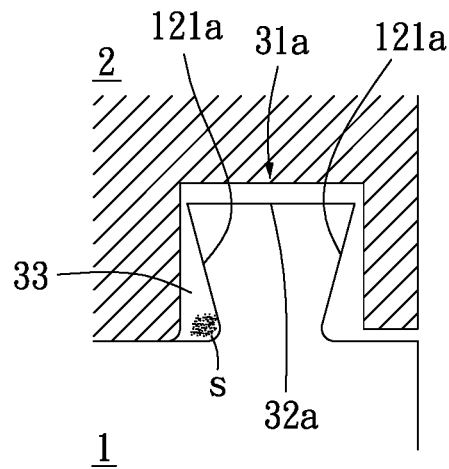
FIG. 5 is a cross-sectional view of the spoiler structure according to the fourth embodiment of the present disclosure.

The cover 2 covers the body 1. A peripheral area 22 (corresponding in position to the peripheral area 12 of the body 1) of the cover 2 and the peripheral area 12 of the body 1 are fitted together by a protruding portion 32 and a dented portion 31. The dented portion 31 and the protruding portion 32 jointly form a spoiler structure 3 which surrounds the reticle allocation area 11. According to the present disclosure, the dented portion 31 and the protruding portion 32 are disposed at the body 1 and the cover 2, respectively, and in a swappable manner. For example, the dented portion 31 is disposed at the body 1, whereas the protruding portion 32 is disposed at the cover 2, as shown in FIG. 1 and FIG. 2. Conversely, the dented portion 31 is disposed at the cover 2, whereas the protruding portion 32 is disposed at the body 1, as shown in FIG. 4 and FIG. 5. In this embodiment, the dented portion 31 is disposed at the body 1, whereas the protruding portion 32 is disposed at the cover 2.

The spoiler structure 3 comprises a spoiler passage 33 disposed between the dented portion 31 and the protruding portion 32. In a cross section taken along line A-A of FIG. 1, the spoiler passage 33 is non-linear. As soon as external air current enters the reticle pod 100 with a spoiler structure, it passes through a straight passage formed between the peripheral area 22 of the cover 2 and the peripheral area 12 of the body 1, and then it passes through the non-linear spoiler passage 33. The gas has to drop and rise within the spoiler passage 33 in order to reach the centrally-located reticle allocation area 11. Therefore, the spoiler passage 33 is effective in lengthening a gas flow path to thereby reduce the likelihood that particles carried by the gas will reach the reticle allocation area 11. Furthermore, referring to FIG. 2, in this embodiment, the body 1 has at least one sidewall 121 in the spoiler passage 33 to form a particle-collecting space S. In detail, the sidewall 121 is at an acute angle of less than 90 degrees and sloping at an inward incline slope to form the particle-collecting space S. When particles carried by an air current enters the sidewall 121, the particles are unlikely to climb across the sidewall 121, thereby confining the particles to the particle-collecting space S. Therefore, the spoiler structure 3 hinders the climb of the air current such that the particles cannot enter the reticle allocation area 11.

Figure 3:
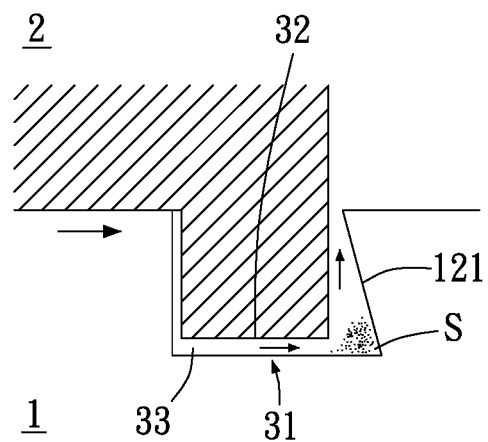
FIG. 3 is a cross-sectional view of the spoiler structure according to the second embodiment of the present disclosure.

Referring to FIG. 3, differences between the second embodiment and the first embodiment are described below. In the second embodiment, the dented portion 31 is disposed at the body 1, the protruding portion 32 is disposed at the cover 2, and the dented portion 31 is flanked by a sidewall 121 from one side. Preferably, the sidewall 121 retreats in the same direction (indicated by the arrow shown) as the advancement of the air current.

Referring to FIG. 2, the dented portion 31 is flanked by the sidewall 121 from two sides to augment the effect of particle collection and the effect of the spoiler.

Referring to FIG. 4, differences between the third embodiment and the first embodiment are described below. In the third embodiment, the dented portion 31a is disposed at the cover 2, whereas the protruding portion 32a is disposed at the body 1 and flanked by a sidewall 121a from one side. Preferably, the sidewall 121a retreats in the same direction (indicated by the arrow shown) as the advancement of the air current.

Referring to FIG. 5, differences between the fourth embodiment and the third embodiment are described below. In the fourth embodiment, the protruding portion 32a is flanked by the sidewall 121a from two sides, so as to augment the effect of particle collection and the effect of a spoiler.

Figure 6:
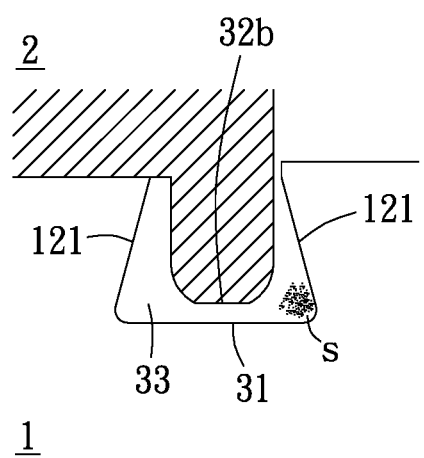
FIG. 6 is a cross-sectional view of the spoiler structure according to the fifth embodiment of the present disclosure.

Referring to FIG. 3, in the second embodiment of the present disclosure, the protruding portion 32 has a rectangular cross section. Referring to FIG. 6, in the fifth embodiment of the present disclosure, the protruding portion 32b has an arcuate cross section. Therefore, the cross section of the protruding portion is of any shape.

Referring to FIG. 3 and FIG. 4, the sidewalls 121, 121a each have an acute angle. Referring to FIG. 2, FIG. 5 and FIG. 6, the sidewalls 121, 121a each have a fillet. Hence, the sidewalls 121, 121a are of any shape and in any number, whereas the protruding portions 32, 32b are of any shape.

While the present disclosure has been described by means of specific embodiments, numerous modifications and variations could be made thereto by those skilled in the art without departing from the scope and spirit of the present disclosure set forth in the claims.

What is claimed is:

1. A reticle pod with a spoiler structure, comprising:
a body which a reticle allocation area is centrally disposed at; and
a cover for covering the body, wherein a peripheral area of the cover and a peripheral area of the body are fitted together by a protruding portion and a dented portion, and the spoiler structure surrounding the reticle allocation area is jointly formed by the dented portion and the protruding portion,
wherein the spoiler structure comprises a spoiler passage disposed between the dented portion and the protruding portion, and the body has at least one sidewall in the spoiler passage, and the sidewall is at an acute angle of less than 90 degree and sloping at an inward incline slope to form a particle-collecting space, and
wherein the protruding portion is received in the dented portion, and the spoiler passage extends continuously along the protruding portion to the cover at both ends of the spoiler passage.

2. The reticle pod with a spoiler structure according to claim 1, wherein the dented portion is flanked by the sidewall from two sides.

3. The reticle pod with a spoiler structure according to claim 1, wherein the dented portion is disposed at the cover, the protruding portion is disposed at the body, and the protruding portion is flanked by a sidewall from one side.

4. The reticle pod with a spoiler structure according to claim 3, wherein the protruding portion is flanked by the sidewall from two sides.

5. The reticle pod with a spoiler structure according to claim 1, wherein the protruding portion has a rectangular cross section.

6. The reticle pod with a spoiler structure according to claim 1, wherein the protruding portion has an arcuate cross section.

7. The reticle pod with a spoiler structure according to claim 1, wherein the retreated sidewall has an acute angle.

8. The reticle pod with a spoiler structure according to claim 1, wherein the sidewall has a fillet.

* * * * *